United States Patent
Kim

(10) Patent No.: US 10,140,914 B2
(45) Date of Patent: Nov. 27, 2018

(54) ORGANIC LIGHT-EMITTING DIODE (OLED) DISPLAY APPARATUS FOR MINIMIZING AN OUTGAS GENERATED DURING A PROCESS OF LASER REPAIRING

(71) Applicant: LG DISPLAY CO., LTD., Seoul (KR)

(72) Inventor: KiDong Kim, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 189 days.

(21) Appl. No.: 15/166,872

(22) Filed: May 27, 2016

(65) Prior Publication Data
US 2017/0178564 A1 Jun. 22, 2017

(30) Foreign Application Priority Data
Dec. 22, 2015 (KR) .................. 10-2015-0183999

(51) Int. Cl.
G09G 3/3208 (2016.01)
G09G 3/00 (2006.01)
H01L 27/32 (2006.01)

(52) U.S. Cl.
CPC .......... *G09G 3/3208* (2013.01); *G09G 3/006* (2013.01); *H01L 27/3246* (2013.01); *H01L 27/3248* (2013.01); *H01L 27/3258* (2013.01); *H01L 27/3265* (2013.01); *H01L 27/3276* (2013.01); *G09G 2320/04* (2013.01); *G09G 2330/08* (2013.01); *G09G 2330/10* (2013.01); *H01L 2251/568* (2013.01)

(58) Field of Classification Search
CPC .. G09G 3/3208; G09G 3/006; G09G 2320/04; H01L 27/3248; H01L 27/3246; H01L 27/3276; H01L 21/76892
See application file for complete search history.

(56) References Cited

U.S. PATENT DOCUMENTS

| | | | |
|---|---|---|---|
| 2005/0116631 A1* | 6/2005 | Kim | H01L 27/3246 313/506 |
| 2006/0226865 A1* | 10/2006 | Gallarda | G02F 1/1309 349/192 |
| 2013/0240914 A1* | 9/2013 | Jin | H01L 27/3246 257/88 |
| 2014/0014913 A1* | 1/2014 | Lee | H01L 21/76894 257/40 |

* cited by examiner

*Primary Examiner* — Kwang-Su Yang
(74) *Attorney, Agent, or Firm* — Dentons US LLP

(57) ABSTRACT

An OLED display apparatus includes a repair portion such that outgas possibly generated during a process of repairing a defective bright spot pixel by making a defective bright spot into a dark spot can be reduced or minimized. At least one pixel including at least one driving element and an organic light-emitting element is disposed on a substrate. A protective layer or a planarization layer for protecting the driving element is on a wiring electrode extended from a source electrode or a drain electrode of the driving element. At least a part of the protective layer or the planarization layer are removed such that outgas generated during a process of repairing the pixel by using a laser is reduced. The at least a part of the protective layer or the planarization layer is defined as a repair portion.

9 Claims, 3 Drawing Sheets

ORGANIC LIGHT-EMITTING DIODE (OLED) DISPLAY APPARATUS FOR MINIMIZING AN OUTGAS GENERATED DURING A PROCESS OF LASER REPAIRING

CROSS-REFERENCE TO RELATED APPLICATIONS

This application claims the priority of Korean Patent Application No. 10-2015-0183999 filed on Dec. 22, 2015, in the Korean Intellectual Property Office, the disclosure of which is incorporated herein by reference.

BACKGROUND

Technical Field

The present disclosure relates to an organic light-emitting diode (OLED) display apparatus and a method of manufacturing the same. More specifically, the present disclosure relates to an OLED display apparatus with improved repairability.

Description of the Related Art

An organic light-emitting diode (OLED) display apparatus has a high luminance and a low operating voltage. In addition, since an OLED display apparatus is a self luminance display apparatus, it has a high contrast ratio and can be made as an ultra-thin display apparatus. Moreover, it has a short response time of several microseconds (µs) and thus, can easily present moving pictures, has little limitation on viewing angle, and can be operated stably even at a low temperature. Further, an OLED display apparatus is driven with a low voltage from DC 5 V to 15 V, and thus, it is easy to design and fabricate a driving circuit.

With such advantages, OLED display apparatuses are recently employed by a variety of IT devices such as TVs, monitors, mobile phones.

A more detailed description of a basic structure of an OLED display apparatus will be given below.

An OLED display apparatus includes an array element and an organic light-emitting element disposed on a substrate. The array element includes a driving element for controlling display data that is connected to a gate line and a data line, and at least one driving thin-film transistor connected to an organic light-emitting element. The organic light-emitting element includes a first electrode connected to the driving thin-film transistor, an organic emission layer, and a second electrode.

The OLED display apparatus as described above may include organic emission layers which are made of luminous materials emitting red, green and blue, respectively, to represent a full color. Alternatively, the OLED display apparatus may include an organic emission layer which is made of an organic luminous material emitting light of white, and color filter patterns containing red, green and blue pigments for pixel regions, respectively, such that the light of white from the organic emission layer passes through the color filter patterns, to represent a full color.

Such an OLED display apparatus may suffer failures arising where the performance of a thin-film transistor may deteriorate or a short-circuit may be formed therein during a process of fabricating lines or switching thin-film transistors and driving thin-film transistors.

If a thin-film transistor formed in a pixel region fails to normally operate, no current or voltage is applied to an organic light-emitting element connected to the thin-film transistor, such that the pixel region becomes a dark spot. On the other hand, if a short-circuit is formed between the source electrode and the drain electrode of the thin-film transistor, the thin-film transistor fails to normally operate such that a voltage applied to the source electrode is not turned on/off but is directly applied to the drain electrode. When this happens, the pixel region remains in an on-state and thus becomes a bright spot.

Once a pixel region becomes a dark spot, it may be very difficult to repair it in the state-of-the-art. If a pixel region becomes a bright spot, there is a way to conceal it by laser cutting the electrical connection between the driving thin-film transistor and the first electrode and the electrical connection to the driving thin-film transistor or a driving element for controlling display data, thereby making the bright spot into a dark spot.

A bright spot can be easily perceived by viewers and thus, degrades display quality. Accordingly, even with a single bright spot, the display apparatus may be regarded as a defective product. On the other hand, a dark spot is rarely perceived by viewers, and thus, ten to twenty dark spots can be typically ignored at the time of releasing a display apparatus. For this reason, a bright spot can be concealed by making it into a dark spot.

However, during a process of repairing using a laser, a planarization layer or a thin-film transistor protective layer made of an organic material may be damaged by a thermal energy created by a laser irradiation, and thus, an outgas containing oxygen or hydrogen may be generated. Such an outgas may react with an organic emission layer or an electrode connected to the organic emission layer of the organic light-emitting element, and more dark spots may be created over time. As a result, the display quality of the OLED display apparatus may be degraded.

As another defects can be created during the process of repairing a bright spot into a dark spot, the cost of repair may be significantly increased, which would result in increased manufacturing costs.

SUMMARY

Accordingly, the present disclosure is directed to an organic light-emitting diode (OLED) display apparatus and a method of manufacturing the same that substantially obviate one or more of the problems due to limitations and disadvantages of the related art.

An advantage of the present disclosure is to provide an OLED display apparatus capable of reducing an outgas that may be generated during a process of repairing a defective bright spot pixel into a dark spot pixel.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

According to an aspect of the present disclosure, there is provided an organic light-emitting diode (OLED) display apparatus capable of reducing or minimizing outgas generated during a process of repairing using a laser. At least one pixel including at least one driving element and an organic light-emitting element is disposed on a substrate. The driving element includes a semiconductor layer, a gate electrode, a source electrode and a drain electrode. The source and drain electrodes are connected to the wiring electrode. A protective layer and a planarization layer are formed on the driving element to protect the driving element. At least a part of the protective layer or the planarization layer are removed such that outgas generated during a process of repairing the pixel by using a laser is reduced. The at least a part of the protective layer or the planarization layer is defined as a repair portion. Therefore, damage by heat from a laser can be minimized during a process of repairing by using the laser to make a bright spot into a dark spot, while minimizing the outgas.

According to another aspect of the present disclosure, an organic light-emitting diode (OLED) display apparatus includes at least one pixel controlled by a driving element, wherein a part of a wiring electrode connected to the driving element is defined as a repair portion for repairing, and a part of a protective layer or a planarization layer on the repair portion is removed such that outgas generated during process of repairing via the repairing portion is minimized.

According to an exemplary embodiment of the present disclosure, a repair portion is provided where at least a part of a protective layer or a planarization layer made of an organic material is removed, such that outgas is minimized. As a result, repair can be carried out more successfully, and thus manufacturing cost can be saved.

Further, a process of repairing can be simpler by using the repair portion.

It should be noted that effects of the present disclosure are not limited to those described above and other effects of the present disclosure will be apparent to those skilled in the art from the following descriptions.

The Summary is not to specify essential features of the appended claims, and thus the scope of the claims is not limited thereby.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
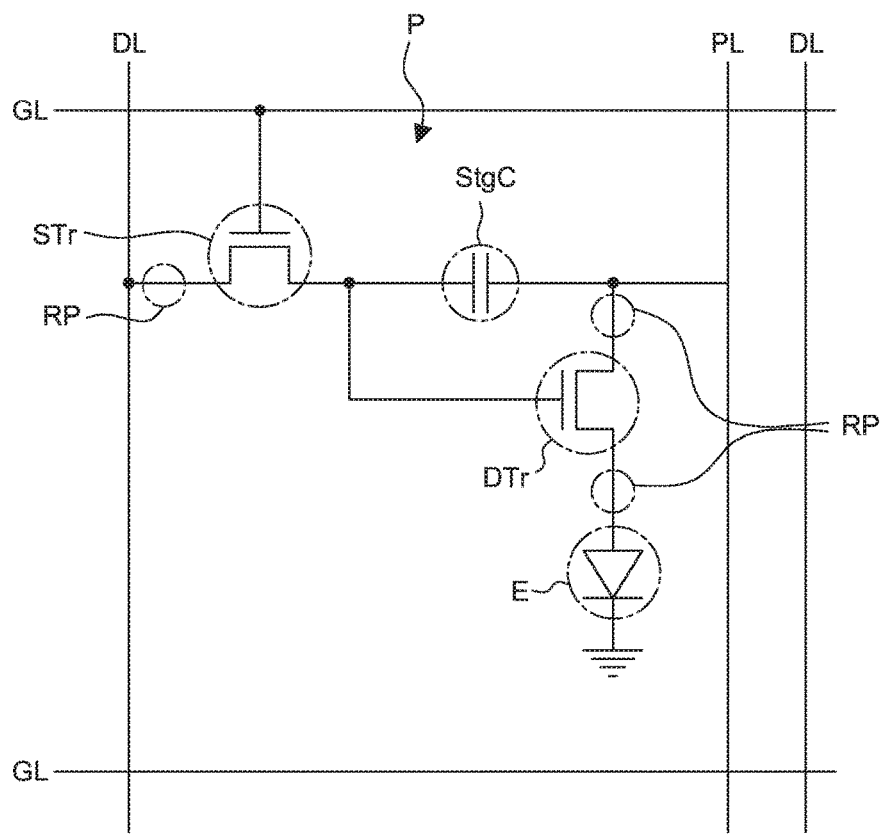
FIG. 1 is a schematic circuit diagram of a pixel of an OLED display apparatus including repair portions for repairing a defective bright spot pixel according to an exemplary embodiment of the present disclosure.

Advantages and features of the present disclosure and methods to achieve them will become apparent from the descriptions of exemplary embodiments hereinbelow with reference to the accompanying drawings. However, the present disclosure is not limited to exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure is defined only by the claims.

The figures, dimensions, ratios, angles, the numbers of elements given in the drawings are merely illustrative and are not limiting. Like reference numerals denote like elements throughout the descriptions. Further, in describing the present disclosure, descriptions on well-known technologies may be omitted in order not to obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element B" and "an element A next to an element B," another element C may be disposed between the elements A and B unless the term "directly" or "immediately" is explicitly used.

In describing flow of signals, such as "a signal is delivered from node A to node B," a signal may be delivered from node A to node B via another node unless the term "directly" or "immediately" is explicitly used.

Features of various exemplary embodiments of the present disclosure may be combined partially or totally. As will be clearly appreciated by those skilled in the art, technically various interactions and operations are possible. Various exemplary embodiments can be practiced individually or in combination.

Hereinafter, exemplary embodiments of the present disclosure will be described in detail with reference to the accompanying drawings.

FIG. 1 is a schematic circuit diagram of a pixel of an OLED display apparatus including repair portions for repairing a defective bright spot pixel according to an exemplary embodiment of the present disclosure.

Referring to FIG. 1, a pixel P of an OLED display apparatus includes a switching thin-film transistor STr that is a driving element for controlling display data, a driving thin-film transistor DTr that is a driving element for controlling current, a storage capacitor StgC, and an organic light-emitting element E.

A gate line GL is extended in a first direction, and a data line DL is extended in a second direction intersecting the first direction, such that a pixel P is defined by the lines. In addition, a power line PL for applying supply voltage is disposed spaced apart from the data line DL.

The driving element STr for controlling display data is disposed near the intersection between the data line DL and the gate line GL. The driving element DTr for controlling current is disposed such that it is electrically connected to the driving element STr for controlling display data.

One terminal of an organic light-emitting element E, i.e., a first electrode, is connected to a drain electrode of the driving element DTr for controlling current, and the other terminal of the organic light-emitting element E, i.e., a second electrode, is grounded. A source electrode of the driving element DTr for controlling current is connected to the power line PL, such that the power line PL delivers the supply voltage to the organic light-emitting element E.

The storage capacitor StgC is formed between a gate electrode and the source electrode of the driving element DTr for controlling current.

When a signal is applied via the gate line GL, the driving element STr for controlling display data is turned on, and the signal from the data line DL is delivered to the gate electrode of the driving element DTr for controlling current to turn on the driving element DTr for controlling current, such that the organic light-emitting element E emits light.

When the driving element DTr for controlling current is tuned on, the level of the current flowing from the power line PL to the organic light-emitting element E is determined, such that the organic light-emitting element E can implemented gray scale. The storage capacitor StgC holds the gate voltage of the driving element DTr for controlling current when the driving element STr is turned off. Accordingly, the level of the current flowing in the organic light-emitting element E can remain constant until the subsequent frame even if the driving element STr for controlling display data is turned off.

As described above, a pixel P of the OLED display apparatus includes at least two driving elements for driving and at least one capacitor for holding the charged voltage.

If the driving elements fail to normally operate as foreign matters are introduced during a process of disposing the driving elements and the organic light-emitting element E, a dark spot or a bright spot defect may arise in the pixel P, as already mentioned above. In order to make a bright spot into a dark spot, there is a way to cut a wiring electrode extended from a source electrode or a drain electrode of the two driving elements in the pixel using a laser, thereby disconnecting the electrical connection.

A repair portion RP for disconnecting the electrical connection using a laser may be formed in a wiring electrode that electrically connects the source electrode of the driving element STr for controlling display data to the data line DL. Alternatively, repair portions RP may be formed in wiring electrodes extended from the source electrode and the drain electrode of the driving element DTr for controlling current, respectively.

Such repairing portions RP are used in cutting a wiring electrode using a laser when a bright spot is created in a pixel P, to release a driving signal or current supplied to the pixel P, thereby making the bright spot into a dark spot. By doing so, viewers may not perceive the defective pixel P.

In the forgoing description, the pixel of the OLED display apparatus has been described as including in its simplest form one driving element for controlling display data and one driving element for control current. However, an organic light-emitting element may further include a plurality of driving elements working as secondary thin-film transistors for stably driving the driving element for control current or for achieving reliable and stable luminance taking into account the location of a pixel in a display area. In this case, connections between the secondary thin-film transistors and the driving element for controlling current and connections between the secondary thin-film transistors and the driving element for control display data or the power line may be modified in a variety of ways.

Figure 2:
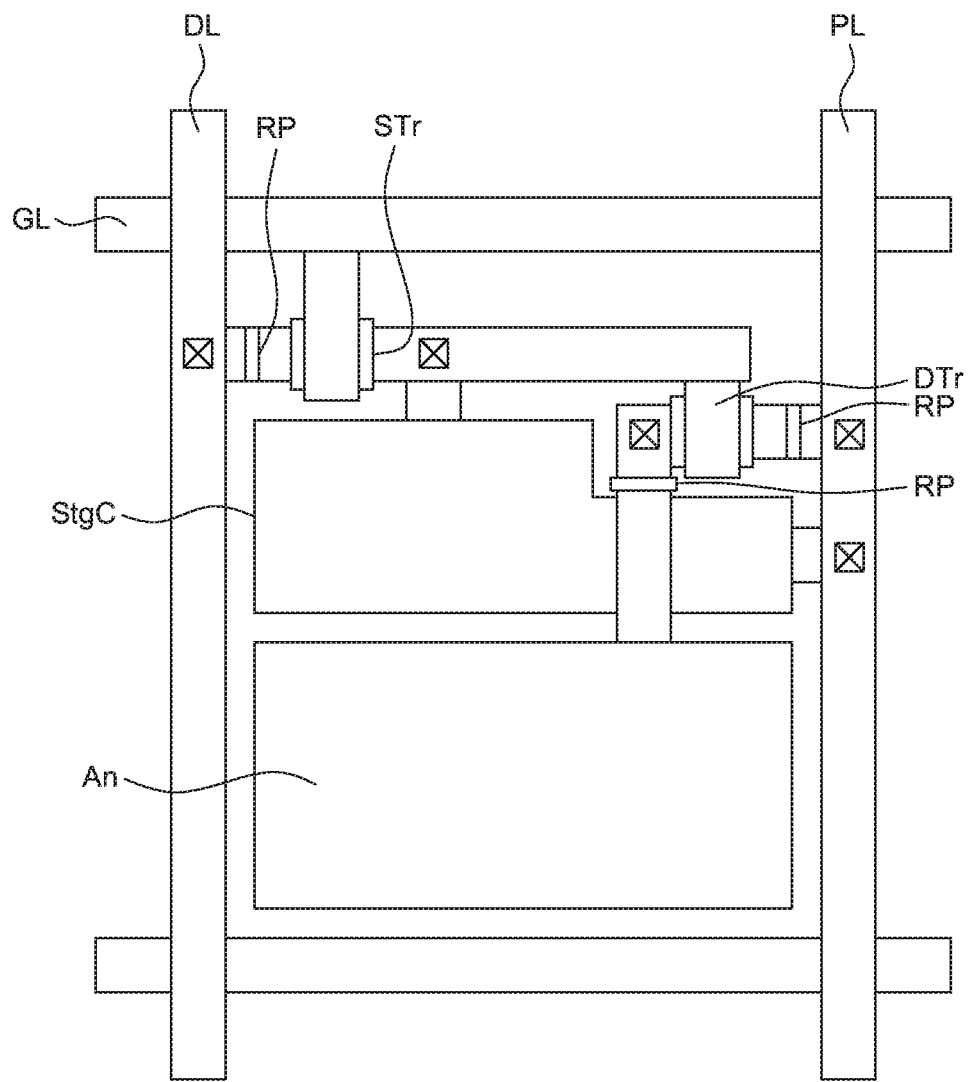
FIG. 2 is a schematic plan view of a pixel of an OLED display apparatus including repair portions according to an exemplary embodiment of the present disclosure.

FIG. 2 is a schematic plan view of a pixel of an OLED display apparatus including repair portions according to an exemplary embodiment of the present disclosure.

Referring to FIG. 2, a gate line GL is extended in a first direction, and a data line DL is extended in a second direction intersecting the first direction. In addition, a power line PL for applying supply voltage is extended in parallel with and spaced apart from the data line DL.

A driving element STr for controlling display data is disposed near the intersection between the data line DL and the gate line GL. A driving element DTr for controlling current is disposed such that it is electrically connected to the driving element STr for controlling display data.

A pixel electrode (an anode) An for supplying current to an organic light-emitting element is connected to a drain electrode of the driving element DTr for controlling current to supply current to the organic light-emitting element, such that the organic light-emitting element emits light. Although the organic light-emitting element is not shown in FIG. 2, it may be referenced to ground potential by a cathode (not shown). A source electrode of the driving element DTr for controlling current is connected to the power line PL, such that the power line PL delivers the supply voltage to the pixel electrode An connected to the organic light-emitting element E.

A storage capacitor StgC is formed between a gate electrode and the source electrode of the driving element DTr for controlling current.

When a signal is applied via the gate line GL, the driving element STr for controlling display data is turned on, and the signal from the data line DL is delivered to the gate electrode of the driving element DTr for controlling current via a wiring electrode extended from the drain electrode of the driving element STr for controlling display data to turn on the driving drive DTr for controlling current, such that the current is supplied to the pixel electrode An. As a result, the organic light-emitting element emits light.

When the driving element DTr for controlling current is tuned on, the level of the current flowing from the power line PL to the organic light-emitting element E is determined. The storage capacitor StgC holds the gate voltage of the driving element DTr for controlling current when the driving element STr for controlling display data is turned off. Accordingly, the level of the current flowing in the pixel electrode An can remain constant until the subsequent frame even if the driving element STr for controlling display data is turned off.

A bright spot defect may arise when such driving elements fail. That is, the driving element STr for controlling display data may fail and thus remain on-state, or the driving element DTr for controlling current may fail and thus it remain on-state to keep supplying current.

As a result, the current keeps being supplied to the organic light-emitting element whether or not the driving signal is applied, resulting in a defective bright spot pixel. When this happens, a wiring electrode connected to the source electrode of the driving element STr for controlling display data or wiring electrodes connected to the source electrode and the drain electrode of the driving element DTr for controlling current are physically cut by using a laser to disconnect electrical connection. By doing so, the driving elements remains off-state, and the pixel becomes a dark spot, which is not easily perceived by users.

To this end, repair portions RP are defined on the wire electrodes extended from the source electrode or the drain electrode of the driving elements.

The repair portions RP may be formed by opening the protective layer or the planarization layer disposed on the wiring electrode, whichever is made of an organic material, such that an amount of outgas generated during a process of repairing using a laser can be reduced or minimized. A portion of the protective layer, the planarization layer, or an organic insulating layer that is removed or opened so as to reduce an amount of outgas during a repair process is also referred to as a repair opening.

A more detail description of the structure of the repair portions RP will be given below.

Figure 3:
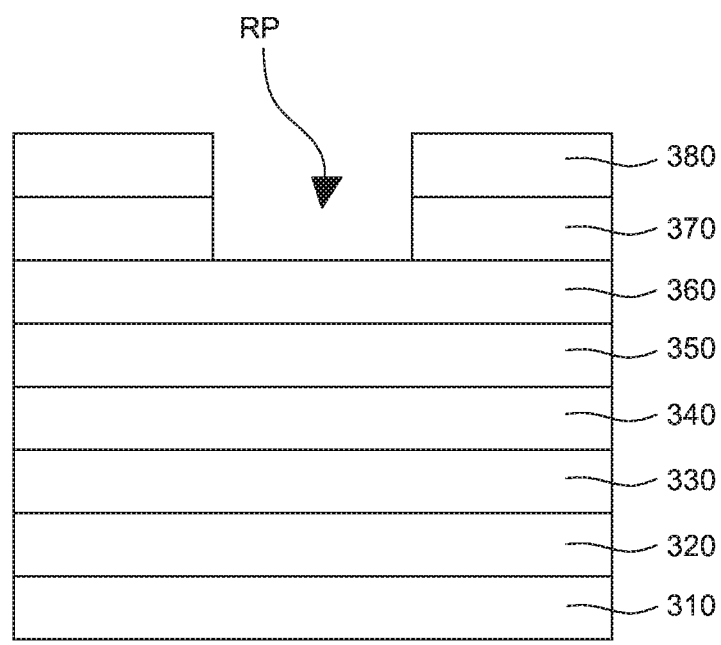
FIG. 3 is a schematic cross-sectional view for illustrating a repair portion of an OLED display apparatus according to an exemplary embodiment of the present disclosure.

FIG. 3 is a schematic cross-sectional view for illustrating a repair portion of an OLED display apparatus according to an exemplary embodiment of the present disclosure.

Referring to FIG. 3, a buffer layer 320 may be disposed on a substrate 310, and then a gate insulating layer 330, an interlayer 340, a wiring electrode 350, a protective layer 360, a planarization layer 370 and a bank layer 380 may be disposed sequentially.

The stack structure shown in FIG. 3 is a cross-sectional view of a repair portion RP formed in a wiring electrode extended from a source electrode or a drain electrode of a driving element.

The substrate 310 may be a glass substrate or a plastic-based flexible substrate. The buffer layer 320 may be made up of multiple layers for blocking a path via which moisture permeates and may be a nitride layer or oxide layer of a silicon nitride layer or a silicon oxide layer.

The interlayer 340 on a gate insulating layer 330 is an inorganic film layer that blocks electrical connection among the gate electrode, the source electrode and the drain electrode and suppresses contamination and damage under the gate electrode.

The wiring electrode 350 is an extended part of the source electrode or the drain electrode of the driving element STr. The driving element may be the driving element for control display data or the driving element DTr for controlling current. The protective layer 360 for protecting the driving element is disposed on the wiring electrode 350. The planarization layer 370 for providing a flat surface may be disposed on the protective layer 360. The bank layer 380 may be disposed on the planarization layer 370.

The repair portion RP is cut in order to disconnecting the electric connection of the wiring electrode 350 by using a laser. If any of the planarization layer 370, the bank layer 380 or the protective layer 360 is made of an organic material, an outgas may be generated due to the heat from the laser, and such an outgas may shorten the lifespan of the organic light-emitting element.

Therefore, parts of the planarization layer 370 and the bank layer 380 in the repair portion RP are removed, and when a bright spot defect arises, a laser is irradiated onto the repair portion RP to physically disconnect the wiring electrode 350. By doing so, an outgas generated during the process of repairing can be reduced or minimized.

The exemplary embodiments of the present disclosure can also be described as follows.

An organic light-emitting diode (OLED) display apparatus capable of reducing or minimizing an outgas generated during a process of repairing using a laser. At least one pixel including at least one driving element and an organic light-emitting element is disposed on a substrate. The driving element includes a semiconductor layer, a gate electrode, a source electrode and a drain electrode. The source and drain electrodes are connected to the wiring electrode. A protective layer and a planarization layer are formed on the driving element to protect the driving element. At least a part of the protective layer or the planarization layer are removed such that outgas generated during a process of repairing the pixel by using a laser is reduced. The at least a part of the protective layer or the planarization layer is defined as a repair portion. Therefore, damage by heat from a laser can be minimized during a process of repairing using the laser to make a bright spot into a dark spot, while reducing or minimizing the outgas.

The pixel may include at least two driving elements performing different functions and a capacitor for holding a charged voltage.

The at least two driving elements may include a driving element for controlling current and a driving element for controlling display data.

The repair portion may be on the wiring electrode extended from the source electrode or the drain electrode of the driving element for controlling current.

The repair portion may be on the wiring electrode extended from the source electrode or the drain electrode of the driving element for controlling display data.

The repair portion may have a structure in which the wiring electrode, the protective layer and the planarization layer are stacked in order, and the planarization layer may have an opened pattern for laser irradiation in the repair portion.

The OLED display apparatus may further include a bank layer on the planarization layer having an opening in the repair portion.

According to an aspect of the present disclosure, an organic light-emitting diode (OLED) display apparatus includes at least one pixel controlled by a driving element, wherein a part of a wiring electrode connected to the driving element is defined as a repair portion for repairing, and a part of a protective layer or a planarization layer on the repair portion is removed such that outgas generated during process of repairing via the repairing portion is minimized.

At least one of the protective layer and the planarization layer may be made of an organic material.

A part of the protective layer or the planarization layer in the repair portion may be removed, whichever is made of the organic material.

The OLED display apparatus may further include a bank layer on the planarization layer having a removed part in the repair portion.

The driving element may be a thin film transistor that has a semiconductor layer.

The wiring electrode may be disconnected corresponding to the repair portion.

The wiring electrode may be disconnected at an area corresponding to the repair portion.

Thus far, exemplary embodiments of the present disclosure have been described in detail with reference to the accompanying drawings. However, the present disclosure is not limited to the exemplary embodiments, and modifications and variations can be made thereto without departing from the technical idea of the present disclosure. Accordingly, the exemplary embodiments described herein are merely illustrative and are not intended to limit the scope of the present disclosure. The technical idea of the present disclosure is not limited by the exemplary embodiments. Therefore, it should be understood that the above-described embodiments are not limiting but illustrative in all aspects. The scope of protection sought by the present disclosure is defined by the appended claims and all equivalents thereof are construed to be within the true scope of the present disclosure.

What is claimed is:

1. An organic light-emitting diode (OLED) display apparatus for minimizing an outgas generated during a process of laser repairing comprising:
   a substrate having a plurality of pixels, all of the plurality of pixels including a driving element and an organic light-emitting element;
   a plurality of wiring electrodes extended from a source electrode or a drain electrode of the driving element in all of the plurality of pixels; and
   an organic insulating layer on the driving element in all of the plurality of pixels, the organic insulating layer having a first repair opening on the wiring electrode in all of the plurality of pixels, wherein at least one of the wiring electrodes corresponding to the first repair opening does not have opening area.

2. The OLED display apparatus of claim 1, further comprising a planarization layer on the organic insulating layer, wherein the planarization layer has a second repair opening corresponding to the first repair opening.

3. The OLED display apparatus of claim 2, wherein the first and second repair openings have a structure in which the wiring electrode, the organic insulating layer and the planarization layer are stacked in order.

4. The OLED display apparatus of claim 2, further comprising a bank layer on the planarization layer, wherein the bank layer has a third repair opening corresponding to the first and second repair openings.

5. The OLED display apparatus of claim 1, wherein the first repair opening reduces an outgas generated during a process of laser repairing one of the plurality of pixels.

6. The OLED display apparatus of claim 1, wherein all of the plurality of pixels comprises at least two driving thin film transistors performing different functions and a capacitor for holding a charged voltage.

7. The OLED display apparatus of claim 6, wherein the at least two driving thin film transistors comprise a driving thin film transistor for controlling an amount of current which is connected to the organic light-emitting element and a driving thin film transistor for controlling a display data which is connected to a gate line and a data line.

8. The OLED display apparatus of claim 7, wherein the first repair opening is on the wiring electrode extended from the source electrode or the drain electrode of the driving thin film transistor for controlling the amount of current.

9. The OLED display apparatus of claim 7, wherein the first repair opening is on the wiring electrode extended from the source electrode or the drain electrode of the driving thin film transistor for controlling the display data.

* * * * *